United States Patent
Seidemann et al.

(10) Patent No.: US 10,431,545 B2
(45) Date of Patent: Oct. 1, 2019

(54) CROSS-CONNECTED MULTI-CHIP MODULES COUPLED BY SILICON BENT-BRIDGE INTERCONNECTS AND METHODS OF ASSEMBLING SAME

(71) Applicant: Intel IP Corporation, Santa Clara, CA (US)

(72) Inventors: Georg Seidemann, Landshut (DE); Bernd Waidhas, Pettendorf (DE); Thomas Wagner, Regelsbach (DE); Andreas Wolter, Regensburg (DE); Laurent Millou, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/637,641

(22) Filed: Jun. 29, 2017

(65) Prior Publication Data
US 2019/0006281 A1    Jan. 3, 2019

(51) Int. Cl.
| | |
|---|---|
| H01L 23/538 | (2006.01) |
| H01L 23/498 | (2006.01) |
| H01L 25/065 | (2006.01) |
| G11C 16/18 | (2006.01) |

(52) U.S. Cl.
CPC ......... *H01L 23/5382* (2013.01); *G11C 16/18* (2013.01); *H01L 23/49861* (2013.01); *H01L 25/0657* (2013.01); *H01L 2224/4826* (2013.01)

(58) Field of Classification Search
USPC ........................................................ 438/618
See application file for complete search history.

(56) References Cited

U.S. PATENT DOCUMENTS

| | | | | |
|---|---|---|---|---|
| 6,567,963 | B1* | 5/2003 | Trezza | G02B 6/43 716/118 |
| 2006/0256037 | A1* | 11/2006 | Kerr | G06F 1/181 345/30 |
| 2008/0157235 | A1* | 7/2008 | Rogers | H01L 21/8258 257/415 |
| 2009/0073168 | A1* | 3/2009 | Jiao | G06T 15/005 345/426 |
| 2010/0176311 | A1* | 7/2010 | Segi | G02B 6/04 250/494.1 |
| 2012/0099269 | A1* | 4/2012 | Tan | G06F 1/20 361/679.32 |
| 2012/0155162 | A1* | 6/2012 | Hanzawa | G11C 7/1039 365/163 |
| 2016/0026220 | A1* | 1/2016 | Stroetmann | G02F 1/133308 345/173 |

FOREIGN PATENT DOCUMENTS

CN          109216340          1/2019

* cited by examiner

*Primary Examiner* — Zandra V Smith
*Assistant Examiner* — Lawrence C Tynes, Jr.
(74) *Attorney, Agent, or Firm* — Schwegman Lundberg & Woessner, P.A.

(57) ABSTRACT

A multi-chip module includes two silicon bridge interconnects and three components that are tied together by the bridges with one of the components in the center. At least one of the silicon bridge interconnects is bent to create a non-planar chip-module form factor. Cross-connected multi-chip silicon bent-bridge interconnect modules include the two silicon bridges contacting the center component at right angles to each other, plus a fourth component and a third silicon bridge interconnect contacting the fourth component and any one of the original three components.

11 Claims, 12 Drawing Sheets

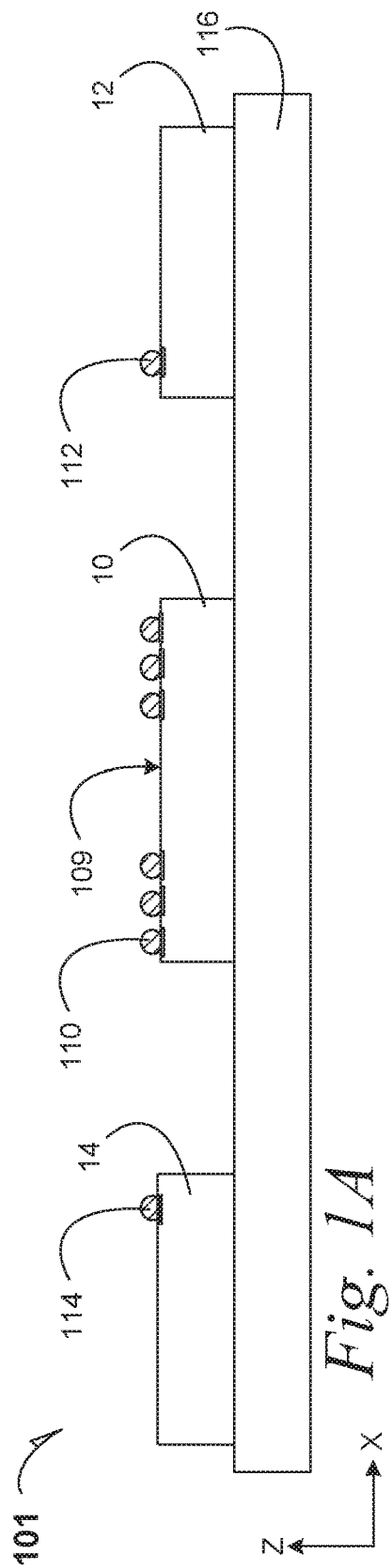
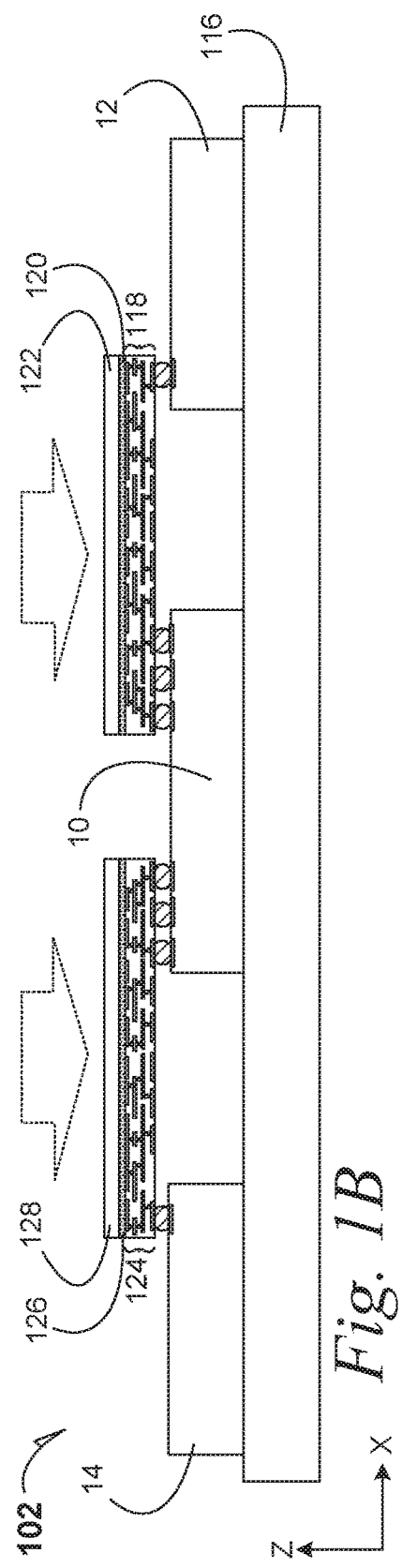
Fig. 1A
Fig. 1B

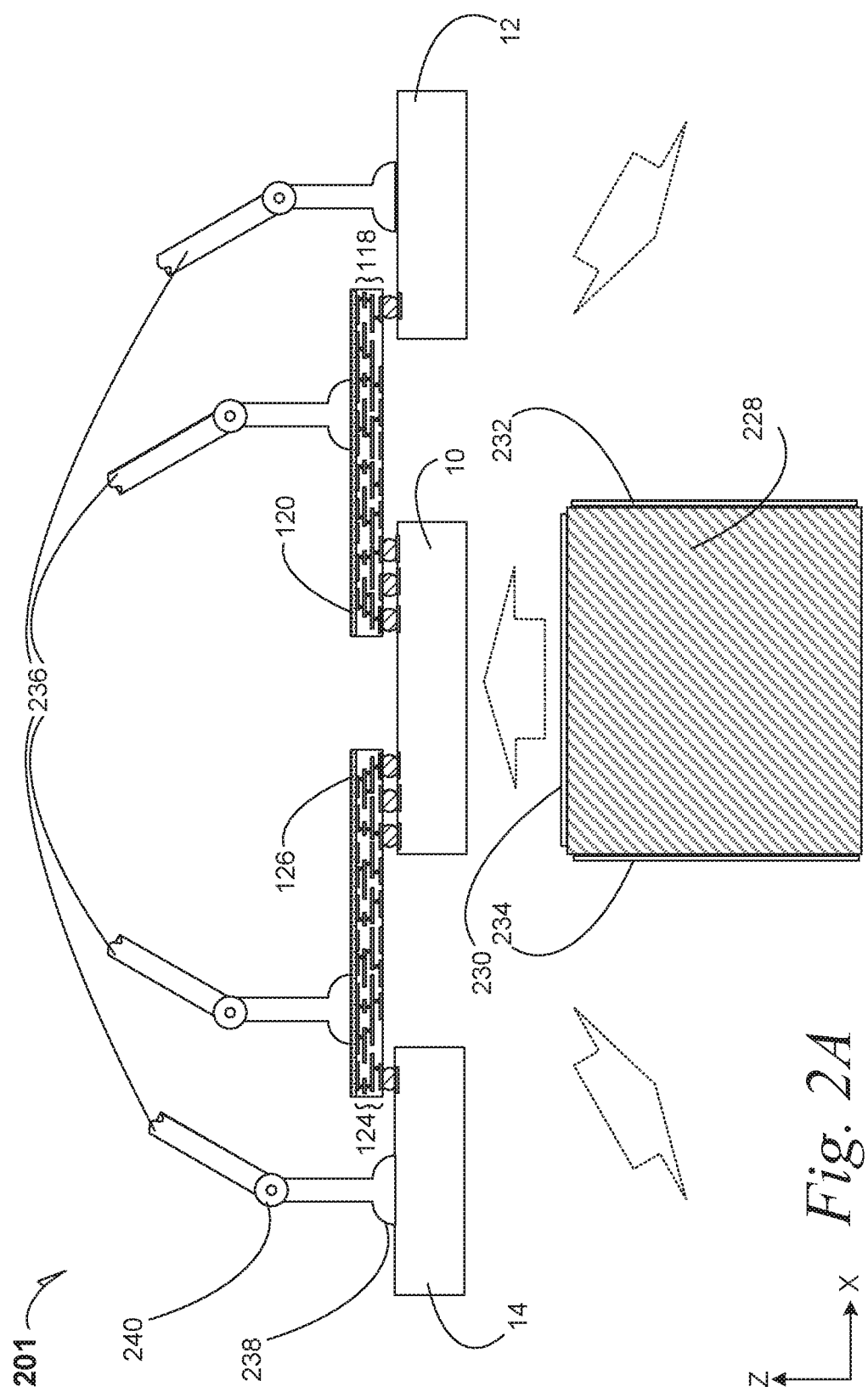

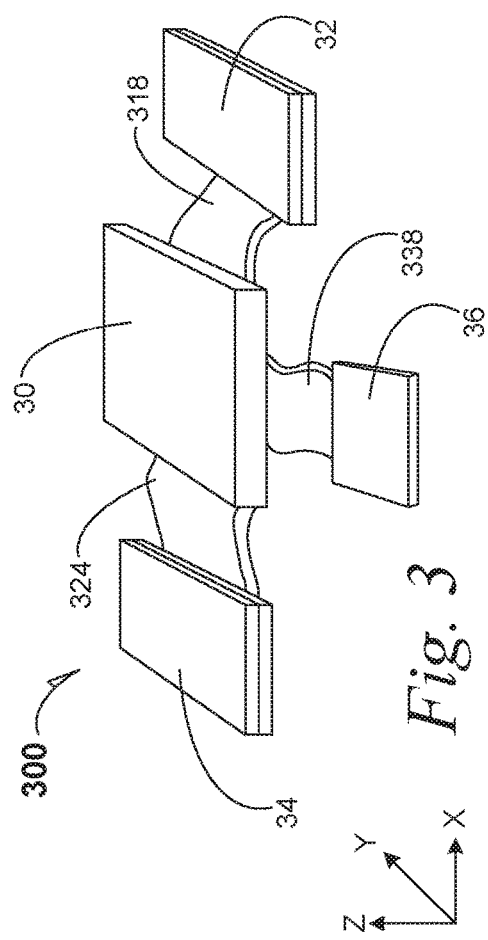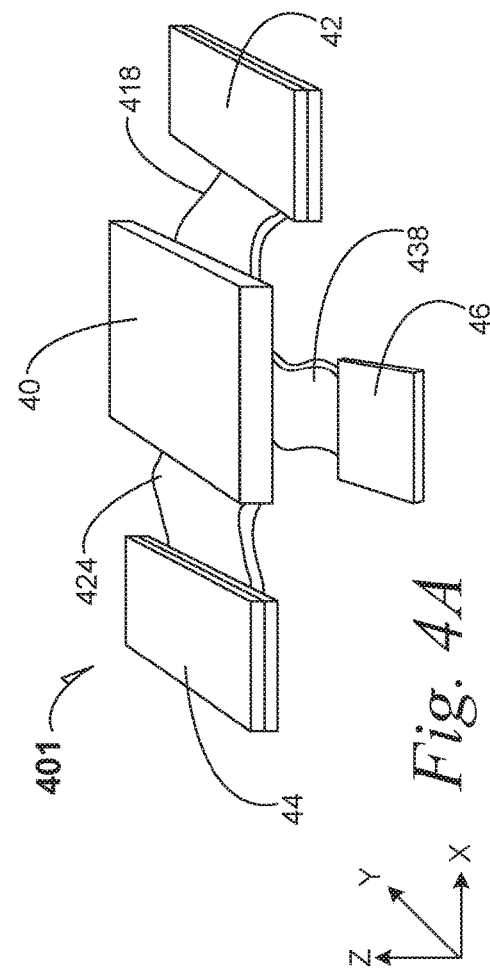

CROSS-CONNECTED MULTI-CHIP MODULES COUPLED BY SILICON BENT-BRIDGE INTERCONNECTS AND METHODS OF ASSEMBLING SAME

FIELD

This disclosure relates to multi-chip packaged devices that are connected by bent-bridge interconnects for non-planar packaging implementations.

BACKGROUND

Semiconductive device miniaturization creates challenges during packaging as device sizes are applied to unusual geometries.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1A is a cross-section elevation of a portion of a silicon bent-bridge interconnect multi-chip module during assembly according to an embodiment;

FIG. 1B is a cross-section elevation of the silicon bent-bridge interconnect multi-chip module depicted in FIG. 1A after further assembly according to an embodiment;

FIG. 2A is a cross-section elevation of the silicon bent-bridge interconnect multi-chip module depicted in FIG. 1F during further processing according to an embodiment;

FIG. 3 is a perspective elevation of a cross-connected silicon bent-bridge interconnect computing apparatus according to an embodiment;

FIG. 4A is a perspective elevation of a cross-connected silicon bent-bridge interconnect computing apparatus during assembly according to an embodiment;

DETAILED DESCRIPTION

Figure 1C:
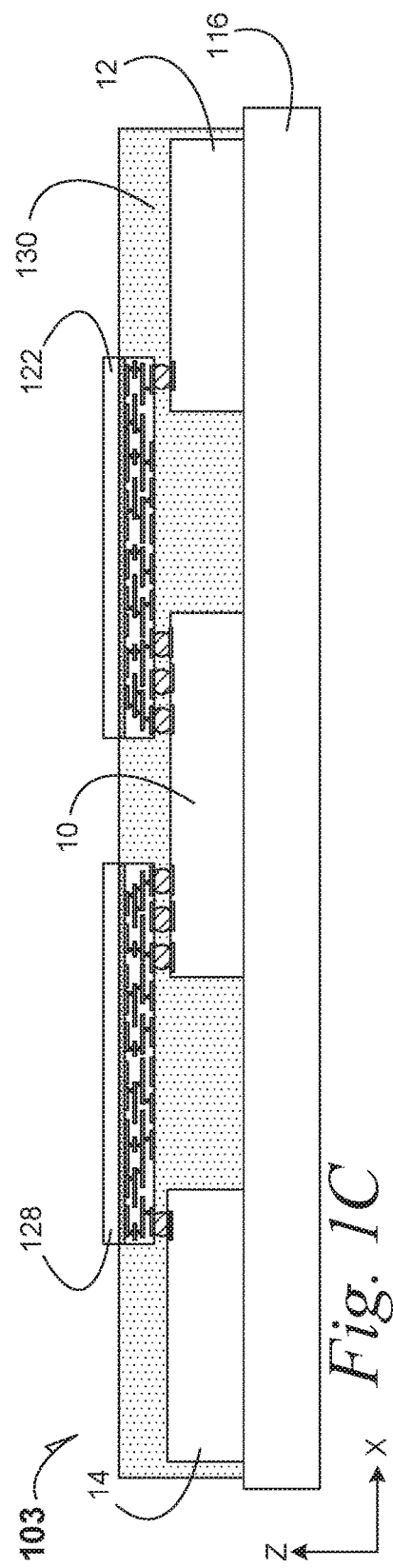
FIG. 1C is a cross-section elevation of the silicon bent-bridge interconnect multi-chip module depicted in FIG. 1B after further assembly according to an embodiment.

A multi-chip module is assembled for non-planar apparatus implementations. Wearable devices are made useful by the non-planar apparatus implementation embodiments, as well as hand-held computing devices in conventional shapes such as a pencil form factor. Other implementation of non-planar multi-chip modules are designed to fit into small, non-planar spaces. Other shapes for multi-chip modules include fuselages for vessels such as an air or water drones.

In an embodiment, at least one memory module is interconnected to a CPU device and silicon-originated high-density bridge interconnects are implemented in bendable constructions. Silicon bridge technology is used to achieve high-density and high-speed interconnects, and the final implementation may include a bent-bridge form factor to accommodate a non-planar geometry.

Several embodiments are referred to as a silicon bent-bridge interconnect, a high-density bent-bridge interconnect, or merely bent-bridge interconnects. In some embodiments, virtually all semiconductive material is removed after silicon-bridge interconnect attachment, but the process involves fabricating the high-density interconnect bridge on a silicon substrate and may therefore still be referred to as a "silicon bent-bridge interconnect (SiBBI)." The several embodiments include at least one of the silicon-bridge interconnects to be bent, hence, a SiBBI embodiment. It is understood that although the silicon section of the interconnect refers to silicon, the materials may be other semiconductive combinations including doped Si, III-V semiconductors, etc. A specific semiconductive material for the "silicon section" may be selected for a useful implementation.

Where all silicon has been removed, signs of remnant silicon may be found such as an etchstop layer that was between the several interconnects and the silicon.

FIG. 1A is a cross-section elevation of a portion of a silicon bent-bridge interconnect (SiBBI) multi-chip module (MCM) 101 during assembly according to an embodiment. The several embodiments may be referred to as SiBBI MCMs.

In most embodiments, at least three components are connected by at least two silicon-bridge interconnects, at least one of which is a silicon bent-bridge interconnect. In these embodiments, one component is designated as a central component.

In an embodiment, a central component 10 such as a semiconductive device 10, for example a processor die 10, including an active surface 109 and the processor die 10, is seated on a carrier 116. The central semiconductive device 10 also includes a backside surface opposite the active surface 109, and the backside surface abuts the carrier 116 opposite the active surface 109. Electrical bumps are seated on the active surface 109, one instance of which is indicated with reference number 110.

A first component 12 and a subsequent component 14 are each assembled to the carrier 116. In an embodiment, the first component is a first memory module 12, and the subsequent component 14 is a subsequent memory module 14. The respective first and subsequent memory modules 12 and 14 are assembled to the carrier 116. Similarly to the central semiconductive device 10, the first memory module 12 is bumped with at least one electrical bump 112. Additionally, the subsequent memory module 14 is bumped with at least one electrical bump 114. The several electrical bumps 110, 112 and 114 are configured to mate with SiBBIs after further assembly. In an embodiment, the several memory modules 12 and 14 include stacked-die memory such as two dice that are stacked within each memory module 12 and 14. In an embodiment, a given memory module includes between three and eight stacked memory dice.

FIG. 1B is a cross-section elevation of the SiBBI multi-chip module 101 depicted in FIG. 1A after further assembly according to an embodiment. The SiBBI multi-chip module 102 has been mated to two silicon-bridge high-density interconnects 118 and 124. The silicon-bridge high-density interconnects 118 and 124 are mated to the several electrical bumps 110, 112 and 114 (see FIG. 1A) as indicated by the directional arrows depicted in dashed lines.

In an embodiment, the silicon-bridge high-density interconnects 118 and 124 are fabricated on respective silicon section 122 and 128, and respective etchstop layer 120 and 126 separate the high-density interconnect 118 and 124 from the respective silicon section 122 and 128.

FIG. 1C is a cross-section elevation of the SiBBI multi-chip module 102 depicted in FIG. 1B after further assembly according to an embodiment. The SiBBI multi-chip module 103 has been supported by applying mass such as a photoresist material 130, for example an organic resist 130. In an embodiment, the mass 130 is formed to a height that exposes the silicon sections 122 and 128. In an embodiment, the mass 130 is not a photosensitive material, but is a material suitable as a mask for the backside that is removable afterwards. This mass 130 may also be heat sensitive such that after use, a heating process causes the mass to be removable. Other compositions may be used such as a wet-etch removable material.

Figure 1D:
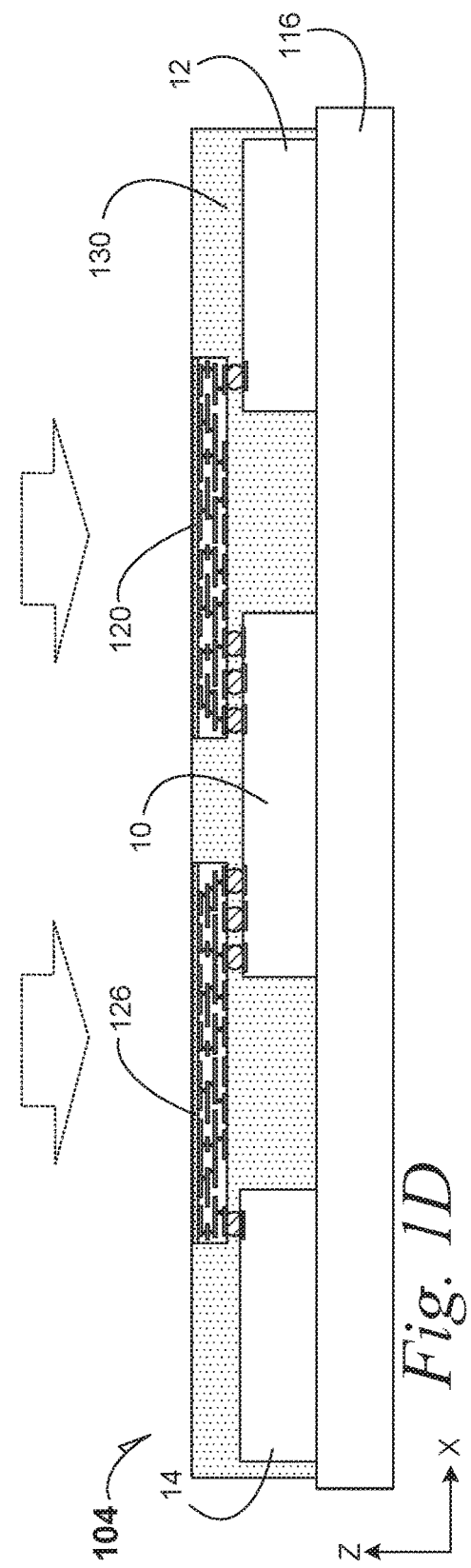
FIG. 1D is a cross-section elevation of the silicon bent-bridge interconnect multi-chip module depicted in FIG. 1C after further assembly according to an embodiment.

FIG. 1D is a cross-section elevation of the SiBBI multi-chip module 103 depicted in FIG. 1C after further assembly according to an embodiment. The SiBBI multi-chip module 104 has been processed by etching or planarizing some, or all of the silicon sections 122 and 128 (see FIG. 1C), to leave the etch-stop layers 120 and 126, as well as the photoresist material 130.

In an embodiment, more than half the vertical thickness of the silicon sections 122 and 128 is etch removed. In an embodiment, more than $9/10^{th}$ the vertical thickness of the silicon sections 122 and 128 is etch removed. In an embodiment, it is useful to retain some of the silicon as it creates a uniform body that assists a bending of the bridges 118 and 124, where likely non-uniform traces and vias may cause bending anomalies. A useful amount of silicon may be retained depending upon a given application. The bent-bridge silicon can be evaluated to distinguish compressive-stress regions on the concave portion of the bent bridge, and tensile-stress regions on the convex portion of the bent bridge. Grain densities are also different between the compressive and tensile regions of the bent bridge, where grain densities are higher in the compressive regions.

The carrier 116 provides both sufficient adhesion to the components 10, 12 and 14 as well as sufficient rigidity during etchback processing to allow some, or all of the silicon sections 122 and 128 to be removed. The directional arrows, depicted in dashed lines, illustrate etching or planarizing processes to remove some, or all of the silicon sections 122 and 128.

Figure 1E:
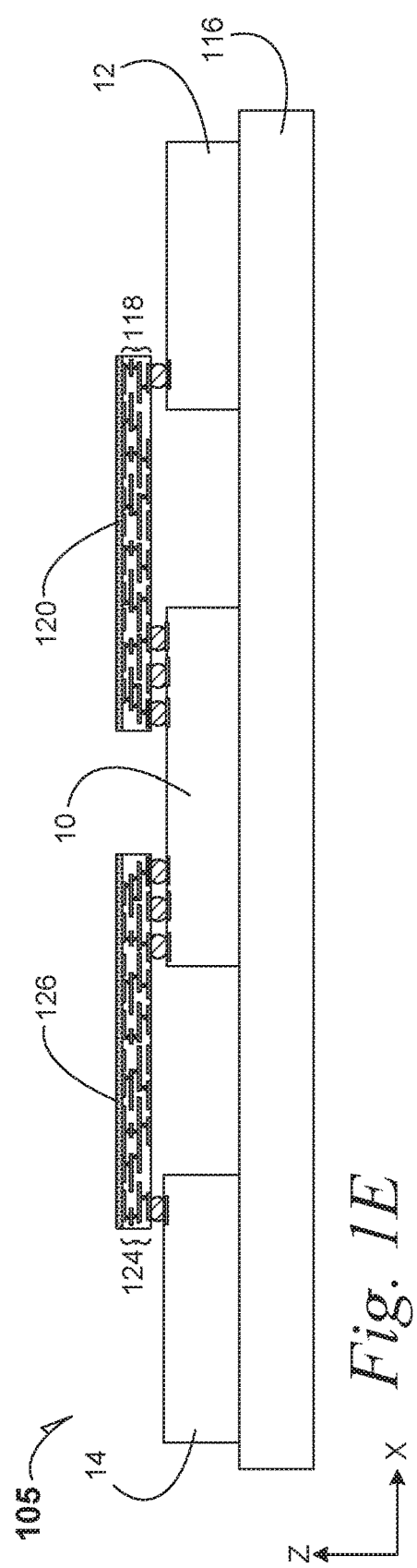
FIG. 1E is a cross-section elevation of the silicon bent-bridge interconnect multi-chip module depicted in FIG. 1D after further assembly according to an embodiment.

FIG. 1E is a cross-section elevation of the SiBBI multi-chip module 104 depicted in FIG. 1D after further assembly according to an embodiment. The SiBBI multi-chip module 105 has been processed to remove the mass 130 in preparation for applying the multi-chip module 105 to a non-non-planar configuration. Although all silicon materials 122 and 128 appear removed in FIG. 1E, it is understood that above-specified amounts of the silicon materials may be retained for purposes discussed herein.

Figure 1F:
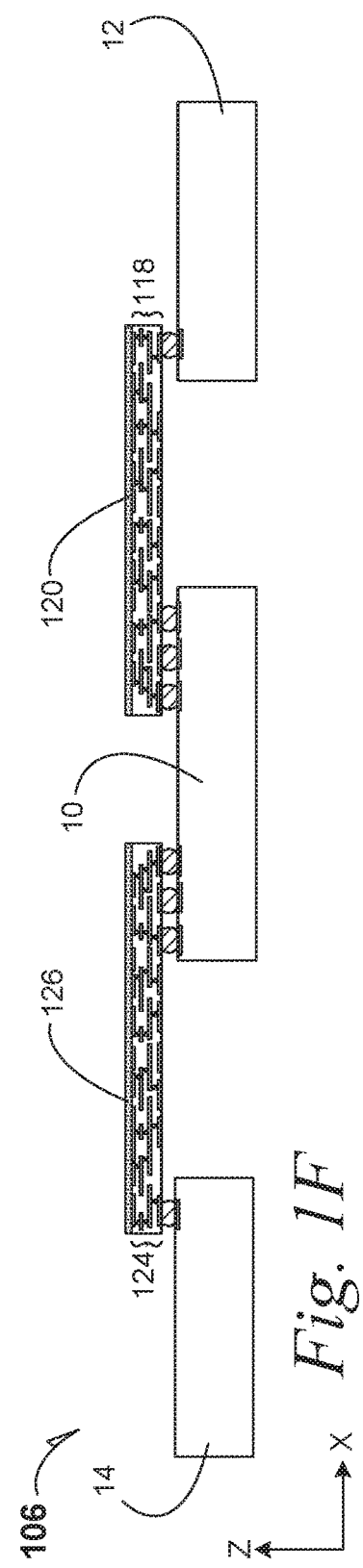
FIG. 1F is a cross-section elevation of the silicon bent-bridge interconnect multi-chip module depicted in FIG. 1E after further assembly according to an embodiment

FIG. 1F is a cross-section elevation of the SiBBI multi-chip module 105 depicted in FIG. 1E after further assembly according to an embodiment. The SiBBI multi-chip module 106 has been processed to remove the carrier 116 in preparation for applying the SiBBI multi-chip module 106 to a non-non-planar configuration.

FIG. 2A is a cross-section elevation of the SiBBI multi-chip module 106 depicted in FIG. 1F during further processing 201 according to an embodiment. The SiBBI multi-chip module has been freed from the carrier 116 (see FIG. 1F) and a heat sink 228 is being urged toward the central component 10 as depicted by the vertical directional arrow, illustrated in dashed lines between the heat sink 228 and the central component 10. In an embodiment, the "heat sink" 228 is not necessarily a high thermal-conductivity material such as copper or silver or steel metal, but the structure 228 serves primarily as a structural support for attached devices and it may incidentally absorb heat generated from the devices that contact it.

In an embodiment, a thermal adhesive 230 has been applied to the heat sink 228 to adhere to the central component 10. Similarly, a first thermal adhesive 232 and a subsequent thermal adhesive 234 have been applied to the heat sink 228 to adhere to the respective first memory module 12 and to the subsequent memory module 14.

In an embodiment, a handling apparatus 236, depicted in part by adhesion 238 and articulation 240 functionalities, is used to first mate the central component 10 onto the thermal adhesive 230. Thereafter, the handling apparatus 236 deflects at least one of the high-density silicon bridge interconnects. As illustrated, the handling apparatus 236 bends the two high-density bridge interconnects 118 and 124, as indicated by the diagonally placed directional arrows. For example, after adhering a processor die 10 to the thermal adhesive 230, the first memory module 12 is mated to the first thermal adhesive 232, and the subsequent memory module 14 is mated to the subsequent thermal adhesive 234.

In an embodiment, the several adhesives 230, 232 and 234 are integrally embedded in the carrier 116 against the several components 10, 12 and 14 (obscured by the carrier 116 in FIGS. 1A through 1F) and as the carrier 116 is removed such as by thermal decomposition or other release-layer techniques, the several adhesives remain attached to the central component 10 and the memory modules 12 and 14. Consequently during assembly depicted in FIG. 2A, the handling apparatus mates the components 10, 12 and 14 with the several adhesives 230, 232 and 234 pre-attached to the respective articles 10, 12 and 14, which therefore finally adhere to the heat sink 228.

In an embodiment, the heat sink 228 is urged against the central component 10, followed by the first high-density bridge interconnect 118 is bent until the first memory module 12 is mated to the first adhesive 232, while holding the subsequent high-density bridge interconnect 124. After the central component 10 and the first memory module 12 have been mated to the heat sink 228, by adhering the processor die 10, bending the first high-density bridge interconnect 118, and adhering the first memory module 12 to the heat sink 228, the subsequent high-density bridge interconnect 124 is bent to allow the subsequent memory module 14 to be adhered to the heat sink 228 by the subsequent thermal adhesive 234.

In an embodiment, the heat sink 228 is urged against the central component 10 and the bridges 118 and 124 with the modules 12 and 14 are urged into a jig such as causes the bridges 118 and 124 to bend and the modules 12 and 14 to mate onto the respective thermal adhesives 232 and 234. By this processing, the equivalent motion achieved by the handling apparatus 236 is achieved on bending the bridges 118 and 124.

Figure 2B:
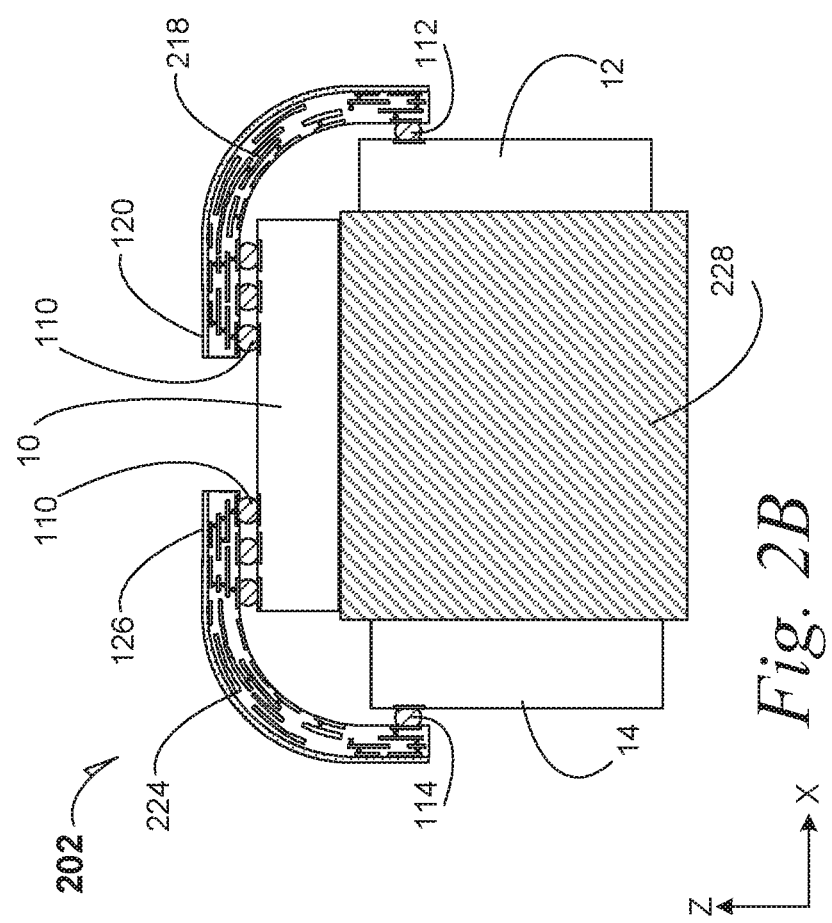
FIG. 2B is a cross-section elevation of a silicon bent-bridge interconnect multi-chip module apparatus according to an embodiment.

FIG. 2B is a cross-section elevation of a SiBBI multi-chip module apparatus 202 according to an embodiment. The SiBBI multi-chip module apparatus 202 may be referred to as a SiBBI computing apparatus 202. In this embodiment, the central component 10 is a CPU processor die 10.

After bending the bridges 118 and 124, depicted in FIG. 2A, the previously planar bridges 118 and 124 become the silicon bent-bridge interconnects 218 and 224 or SiBBIs 218 and 224. The silicon bent-bridge interconnects 218 and 224 retain high-density interconnections between the processor die 10 and the respective first and subsequent memory modules 12 and 14.

In an embodiment, the achieved SiBBI computing apparatus 202 has a non-planar form factor that allows the SiBBI computing apparatus 202, in this instance a SiBBI memory-modules computing apparatus 202, to be deployed in a compact geometry compared to a planar geometry.

It may now be appreciated that the processing depicted in FIGS. 1A through 2B can be applied to a cross-connected SiBBI computing apparatus where two given silicon bent-bridge interconnects are arranged, for example, orthogonal to each other but which are connected to the same central-component die. Several such embodiments are disclosed herein.

FIG. 3 is a perspective elevation of a cross-connected silicon bent-bridge interconnect computing apparatus 300 according to an embodiment. Hereinafter, a central component may be referred to as a processor die. Similarly where a component is connected by a SiBBI, it may be referred to as a component or as a device such as an active semiconductive device.

A processor die 30 is connected to a first memory module 32 with a first silicon bent-bridge interconnect 318, or SiBBI 318. The processor die 30 is also connected to a subsequent memory module 34 with a subsequent high-density bent-bridge interconnect 324, or SiBBI 324. Processing embodiments of the SiBBIs 318 and 324 are carried out from silicon-bridge structures as set forth and generally described in FIGS. 1A to 1F and 2A to 2B.

In an embodiment, the device 30 is a central-processing unit 30 and the device 32 is a memory module 32, such as a stacked-die memory module 32 (at least two memory dice in the stacked-die memory module 32). In an embodiment, the number of memory dice in the memory module 32 ranges from three to eight. Further, the device 34 is also a memory module 34, such as a stacked-die memory module 34 (at least two memory dice in the stacked-die memory module 34). In an embodiment, the number of memory dice in the memory module 34 ranges from three to eight.

In an embodiment, the device 36 is connected to the device 30 with a SiBBI 338 that has been fabricated from silicon-bridge structure embodiments as set forth and generally described in FIGS. 1A to 1F and 2A to 2B. Consequently as the SiBBIs 318 and 338 connect to the device 30 at a right angle, the apparatus 300 is a cross-connected SiBBI apparatus 300.

In an embodiment, the device 36 is a connector with functionality such as a platform-controller hub (PCH) 36. In an embodiment, the device 36 is a connector with functionality such as a memory-controller hub (MCH) 36. In an embodiment, the device 36 is a connector with functionality such as both a PCH 36 and an MCH 36.

FIG. 4A is a perspective elevation of a cross-connected silicon bent-bridge interconnect computing apparatus 401 during assembly according to an embodiment. A processor die 40 is connected to a memory module 42 with a first SiBBI 418. The processor die 40 is also connected to an antenna device 44 with a SiBBI 424. Processing of the SiBBIs 418 and 424 is carried out from silicon-bridge structures as set forth and generally described in embodiments depicted in FIGS. 1A to 1F and 2A to 2B.

In an embodiment, the device 40 is a central-processing unit 40 and the device 42 is a memory module 42, such as a stacked-die memory module 42 (at least two memory dice in the stacked-die memory module 42). In an embodiment, the number of memory dice in the memory module 42 ranges from three to eight.

In an embodiment, the device 44 is an antenna device such as phased-array patch antenna module 44. In an embodiment, the device 46 is a motion sensor chip 46 with functionality such as a motion, acceleration, and temperature.

In an embodiment, the several devices 42, 44 and 46 are respectively connected to the device 40 with high-density SiBBIs 418, 424 and 438, each of which has been fabricated from a silicon-bridge structure as set forth and generally described by processing embodiments depicted in FIGS. 1A to 1F and 2A to 2B.

Figure 4B:
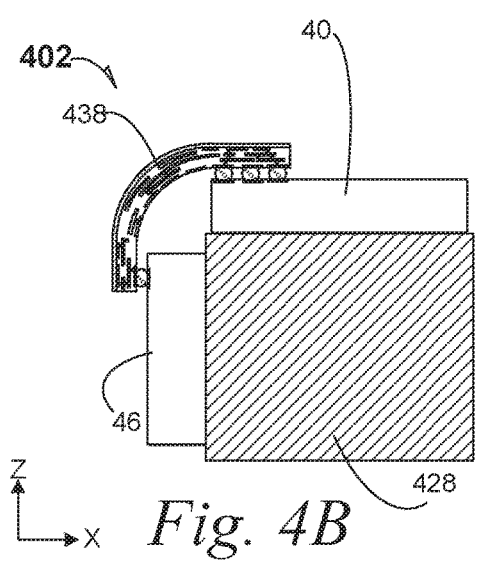
FIG. 4B is a cross-section elevation of the cross-connected silicon bent-bridge interconnect computing apparatus depicted in FIG. 4A after further assembly according to an embodiment.

FIG. 4B is a cross-section elevation of the cross-connected silicon bent-bridge interconnect computing apparatus 401 depicted in FIG. 4A after further assembly according to an embodiment. The cross section is taken including the device 40 and the device 46 after assembling to a heat sink 428. The cross-connected multi-chip SiBBI computing apparatus 402 has been urged against the heat sink 428, and SiBBI 438 has bent to allow the devices 40 and 46 to be adhered to the heat sink. If a cross section were viewed orthogonal to the illustration in FIG. 4B, a structure similar to the apparatus 202 depicted in FIG. 2B would be visible where the devices 40, 42 and 44 would be substituted into FIG. 2B for the devices 10, 12 and 14.

Figure 5:
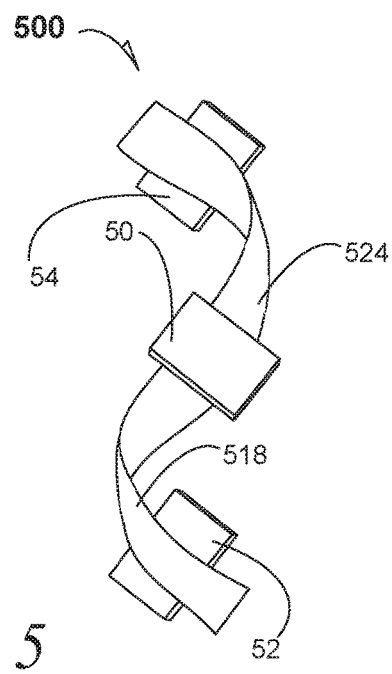
FIG. 5 is a silicon bent-bridge interconnected computing apparatus according to an embodiment.

FIG. 5 is a silicon bent-bridge interconnected computing apparatus 500 according to an embodiment. A processor die 50 is connected to a memory module 52 by a SiBBI 518 according to an embodiment. Processing of the SiBBI 518 is carried out from silicon-bridge structures as set forth and generally described by described embodiments depicted FIGS. 1A to 1F and 2A to 2B. The three components 50, 52 and 54 are configured linearly.

In an embodiment, the processor die 50 is also connected to a modem 54, such as to a transceiver 54 for telecommunication capability of the computing apparatus 500. The modem 54 is connected to the processor die 50 by a SiBBI 524 according to an embodiment. Processing of the SiBBI 524 is carried out from silicon-bridge structures as set forth and generally described in embodiments in FIGS. 1A to 1F and 2A to 2B.

As illustrated, the SiBBIs 518 and 524 have been torsioned to give the overall appearance of a helical SiBBI form factor. This helical form factor is a variety of a generically silicon bent-bridge interconnect multi-chip module. In an embodiment, the SiBBIs 518 and 524 are a signal integral structure that has been fabricated from a single silicon-bridge structure as set forth and generally described in FIGS. 1A to 1F and 2A to 2B.

In an embodiment, the device 54 is a CPU, the device 50 is a platform controller hub, and the device 52 is a memory module.

The overall helical form factor of the SiBBI apparatus 500 may be installed in an elongate, narrow container such as a conventional barrel of a pen for writing.

Figure 6:
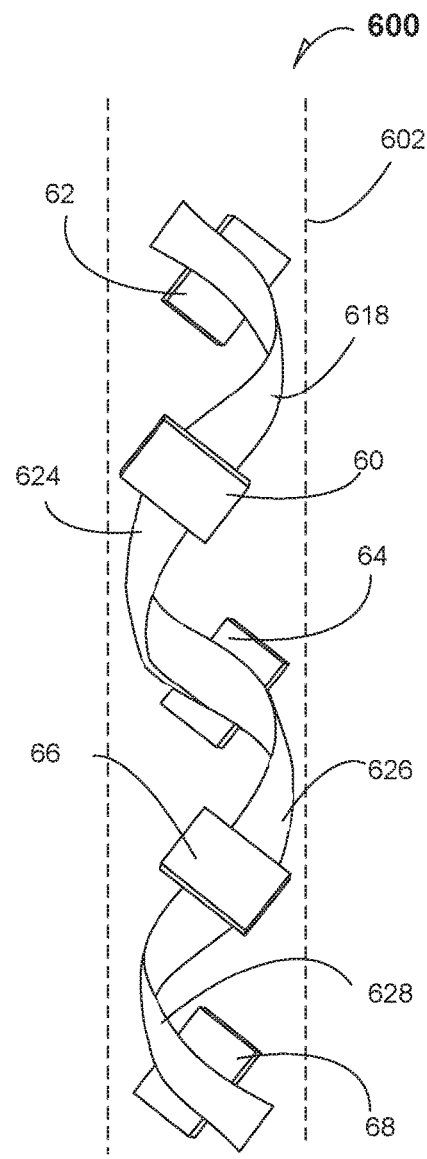
FIG. 6 is a cross-connected silicon bent-bridge interconnect computing apparatus according to an embodiment.

FIG. 6 is a cross-connected SiBBI computing apparatus 600 according to an embodiment. The SiBBI computing apparatus 600 is enclosed within an elongated shape 602, such as fuselage of a miniature drone vessel for air travel or water travel, according to an embodiment. In an embodiment, the elongated shape 602 is useful for a handheld computing system such as a conventional writing implement. Other useful applications are available for the elongated shape 602. In any event, the shape 602 represents an external shell for a computing system.

A processor die 60 is connected to a memory module 62 by a SiBBI 618 according to an embodiment. Processing of the SiBBI 618 is carried out from silicon-bridge structures as set forth and generally described by described embodiments depicted FIGS. 1A to 1F and 2A to 2B. Additionally, a geo-positioning system (GPS) device 64 is used for navigation and motion sensing and the GPS device 64 is connected to the processor die 60 by a SiBBI 624. Additionally, an antenna module 66 such as a phased-array patch antenna module 66 is connected to the processor die 60 through the device 64, although when the SiBBIs 626 and 624 are continuous, communication between the devices 66 and 60 can bypass the device 64 according to an embodiment.

In an embodiment, an additional device 68 is located distant from the memory module 62, such as a sensor 68 that may experience more motion than the sensors within the GPS device 64 such that the stability of the elongated shape 602 may be controlled such as when the computing system 600 is a moving vessel.

Figure 7:
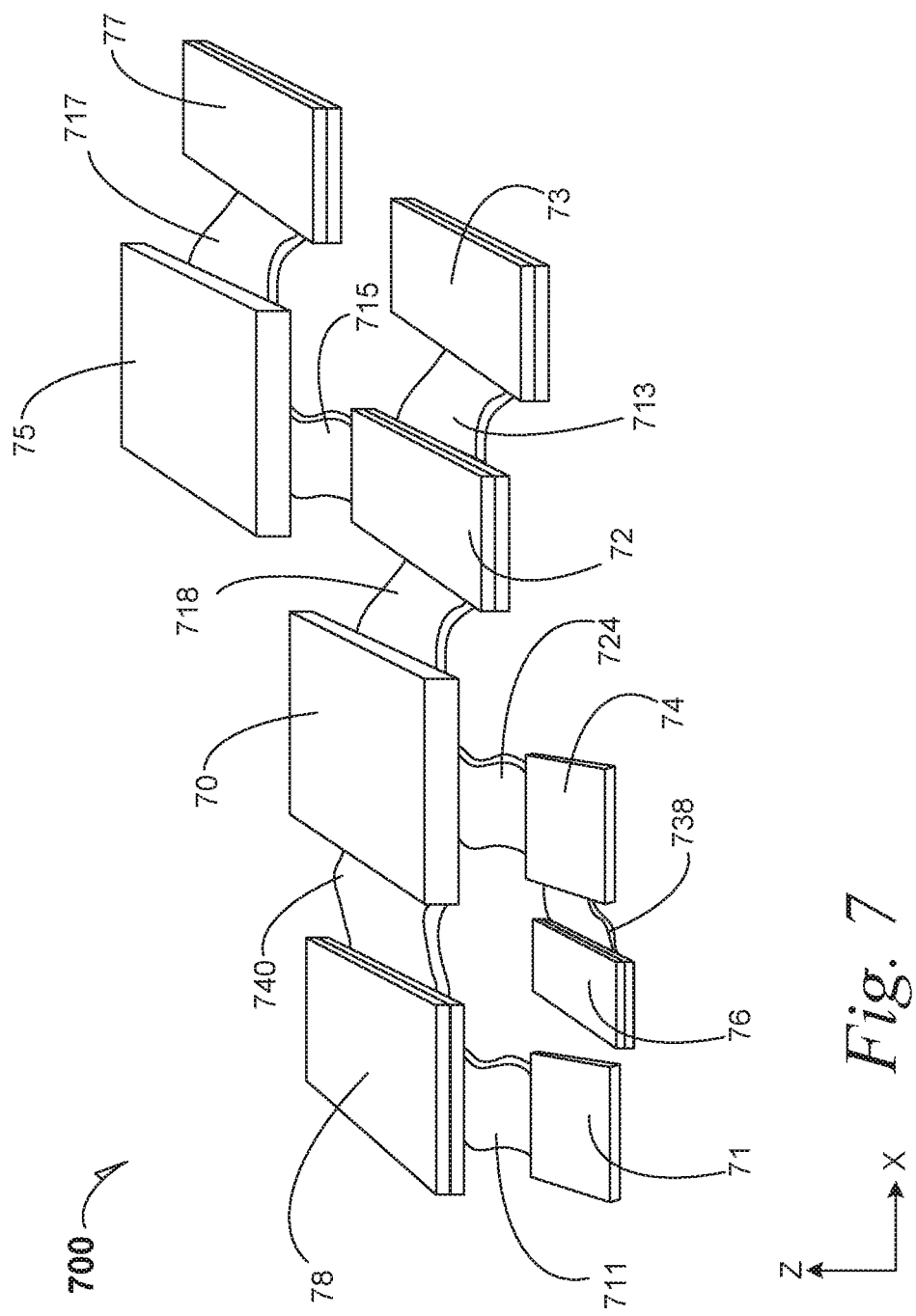
FIG. 7 is a perspective elevation of a convoluted cross-connected silicon bent-bridge interconnect computing apparatus according to an embodiment.

FIG. 7 is a perspective elevation of a convoluted cross-connected silicon bent-bridge interconnect computing apparatus 700 according to an embodiment. A tapestry of semiconductive devices and other devices is assembled where at least one device is connected to two adjacent devices by a right-angle form factor, and at least one of the devices is also cross-connected with a fourth device. Although bridges are depicted throughout as, either in-line (180-degree) with two given devices, or as right-angle to two devices, other angles may be useful. In an embodiment, two devices are coupled to a central device by bridges at a 45-degree angle. In an embodiment, two devices are coupled to a central device by bridges at a 20-degree angle. In an embodiment, two devices are coupled to a central device by bridges at a 5-degree angle. In an embodiment, two devices are coupled to a central device by bridges at a 63-degree angle. In an embodiment, two devices are coupled to a central device by bridges at an 83-degree angle. Other angles between zero-degree and 180-degree angles may be employed where useful.

In an embodiment, a CPU device 70 is cross-connected the devices 72 and 74 such as with a memory module 72 by a SiBBi 718, and also with an external connector device 74 by a SiBBI 724. It is seen that the devices 70, 72 and 74 are configured in a right-angle form factor. Additionally, the device 74 is also cross-connected with the devices 70 and 76 in a right-angle form factor. Consequently, the two cross-connected configurations 70, 72 and 74, and 70, 74 and 76 make up a convoluted cross-connected SiBBI computing configuration.

In an embodiment, a device 78 such as a subsequent memory module 78 connected by a SiBBI 740 to the device 70 according to an embodiment. As such the devices 78, 70 and 74 form a cross-connected right-angle form factor.

Other devices 71, 73, 75 and 77 complete a tapestry of devices with the devices 70, 72, 74, 76 and 78. Several SiBBIs 711, 713 715 and 717 are used in several connective configurations. In an embodiment, the device 71 is a motion sensor. In an embodiment, the device 73 is a motion sensor. In an embodiment, the device 75 is a GPS. In an embodiment, the device 77 is a wireless transceiver.

As disclosed by embodiments set forth in FIG. 7, different technologies and technology nodes are incorporated into a silicon bent-bridge interconnect apparatus.

Figure 8:
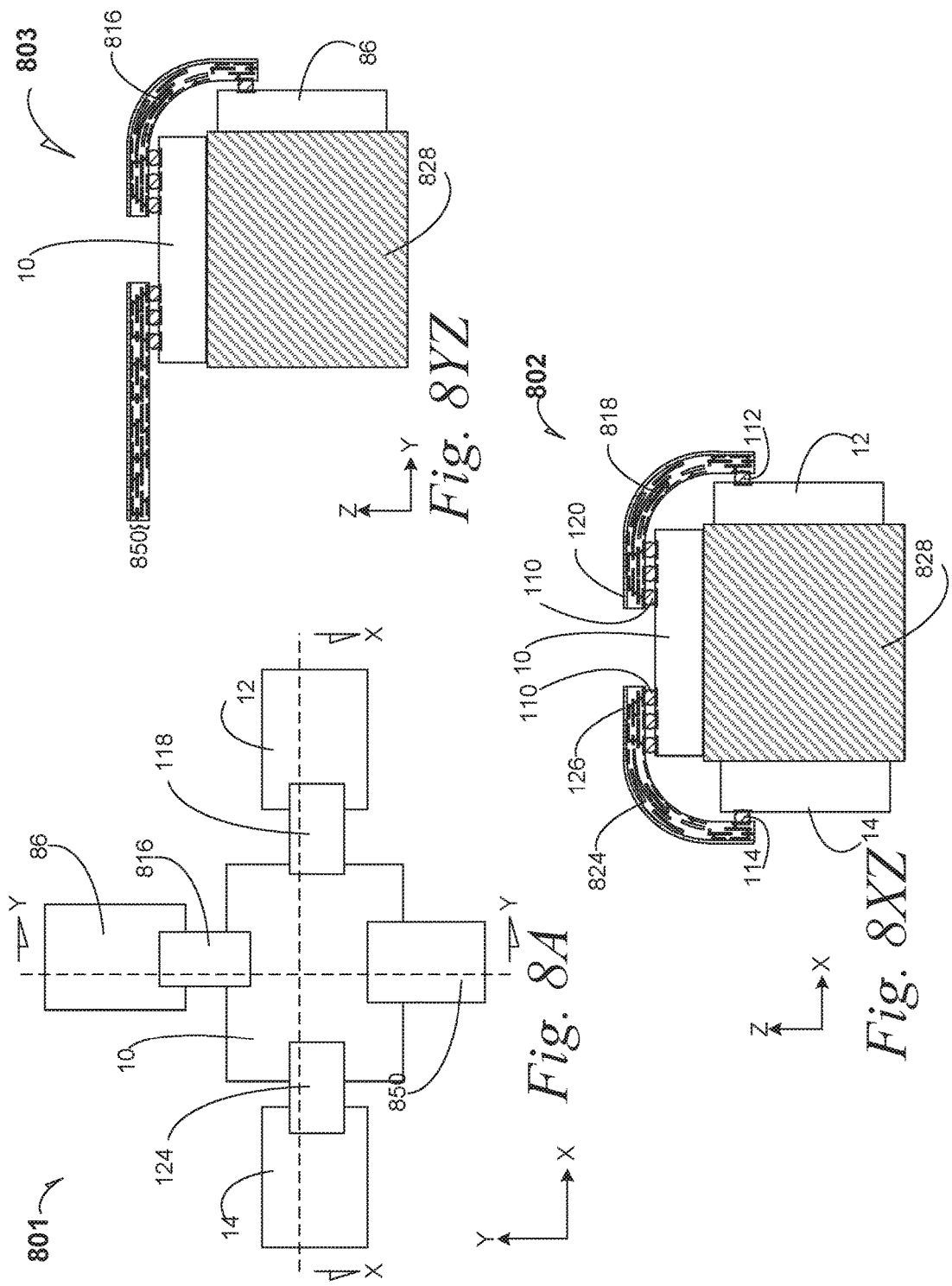
FIG. 8A is a top plan of a cross-connected silicon bent-bridge interconnect computing apparatus during assembly according to an embodiment.
FIG. 8XZ is a cross-section elevation of a silicon bent-bridge interconnect multi-chip module apparatus after further assembly of the silicon bent-bridge interconnect multi-chip module apparatus depicted in FIG. 8A according to an embodiment.
FIG. 8YZ is a cross-section elevation of a silicon bent-bridge interconnect multi-chip module apparatus after further assembly of the silicon bent-bridge interconnect multi-chip module apparatus depicted in FIG. 8A according to an embodiment.

FIG. 8A is a top plan of a cross-connected silicon bent-bridge interconnect computing apparatus 801 during assembly according to an embodiment. Similar structures may be viewed partially from FIG. 1F. In FIG. 8 the devices 10, 12 and 14 can be mapped from FIG. 1F to a processor die 10 and first and subsequent memory modules 12 and 14 that are connected to the processor die 10 by respective silicon-bridge interconnects 118 and 124.

Further structure of the cross-connected SiBBI computing apparatus 801 includes a third memory module 86 with a third silicon-bridge interconnect 816 connecting the processor die 10 thereto.

In an embodiment, an input/output (I/O) silicon-bridge interconnect 850 is coupled to the processor die 10 for further interconnectivity such as to the outside world for a computing system.

FIG. 8XZ is a cross-section elevation of a SiBBI multi-chip module apparatus 802 after further assembly of the SiBBI multi-chip module apparatus 801 depicted in FIG. 8A according to an embodiment. The cross-sectional view may be taken from the cross-section line X-X seen in FIG. 8A. The cross-section view, however, is seen after bending of the SiBBIs 118 and 124 depicted in FIG. 8A. The SiBBI multi-chip module apparatus 802 may be referred to as a SiBBI computing apparatus 802.

After bending the bridges 118 and 124, depicted in FIG. 8A, the previously planar bridges 118 and 124 become the silicon bent-bridge interconnects 818 and 824 or SiBBIs 818 and 824. The silicon bent-bridge interconnects 818 and 824 retain high-density interconnections between the processor die 10 and the respective first and subsequent memory modules 12 and 14.

In an embodiment, the achieved SiBBI computing apparatus 802 has a non-planar form factor that allows the SiBBI computing apparatus 802, in this instance a SiBBI memory-modules computing apparatus 802, to be deployed in a compact geometry compared to a planar geometry.

It may now be appreciated that the processing depicted in FIGS. 1A through 1F and 8A through 8XZ can be applied to a cross-connected SiBBI computing apparatus where a given two bent-bridge interconnects are arranged, for example, orthogonal to each other but which are connected to the same die.

FIG. 8YZ is a cross-section elevation of a SiBBi multi-chip module apparatus 803 after further assembly of the SiBBI multi-chip module apparatus 801 depicted in FIG. 8A according to an embodiment. The cross-sectional view may be taken from the cross-section line Y-Y seen in FIG. 8A. The cross-section view, however, is seen after bending of the SiBBI 816 depicted in FIG. 8A. The SiBBI multi-chip module apparatus 803 may be referred to as a SiBBI computing apparatus 802.

After bending the bridge 816 depicted in FIG. 8A, but not bending the bridge 850, the previously planar bridge 816 becomes bent, but the bridge 850 remains virtually the same planar form factor experienced during assembly. The SiBBI 850 retains high-density interconnections between the processor die 10 and the third memory module 86, but the silicon bridge 850 retains the substantially planar form factor experienced during assembly.

Figure 9:
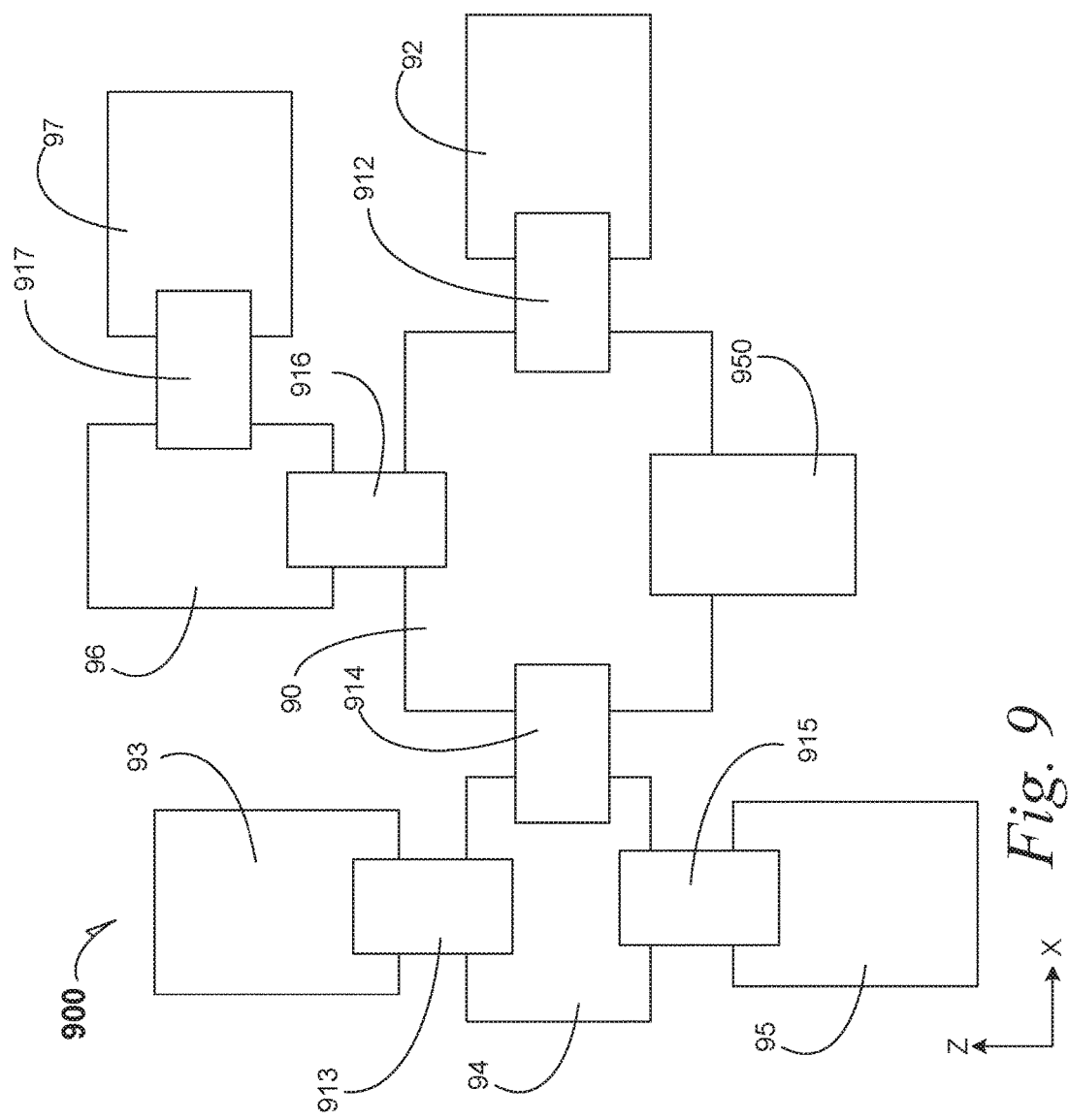
FIG. 9 is a top plan of a cross-connected silicon bent-bridge interconnect computing apparatus according to an embodiment.

FIG. 9 is a top plan of a cross-connected silicon bent-bridge interconnect computing apparatus 900 according to an embodiment. A tapestry of semiconductive devices and other devices is assembled where at least one device is connected to two adjacent devices by a right-angle form factor, and at least one of the devices is also cross-connected with a fourth device.

In an embodiment, a CPU device 90 is cross-connected the devices 92 and 94 such as with a memory module 92 by a SiBBi 912, and also with a modem 94 by a SiBBI 914.

In an embodiment, the modem 94 is coupled to an antenna module 93 and to a memory module 95 by respective SiBBIs 913 and 915. The modem 94 is cross-connected to the CPU 90 and to the antenna module 93, where a right-angle form factor is created by the SiBBIs 914 and 913. Similarly, the modem 94 is cross-connected to the CPU 90 and the memory module 95 by respective SiBBIs 914 and 915.

In an embodiment, a sensor 96 is coupled to the CPU device 90 by a SiBBI 916, and the sensor 96 is coupled to the sensor 96 by a SiBBI 917. Accordingly, the sensor 96 is cross-coupled to the CPU 90 and the memory module 97 by respective SiBBIs 916 and 917.

In an embodiment, an input/output (I/O) silicon-bridge interconnect 950 is coupled to the processor die 10 for further interconnectivity such as to the outside world for a computing system.

Figure 10:
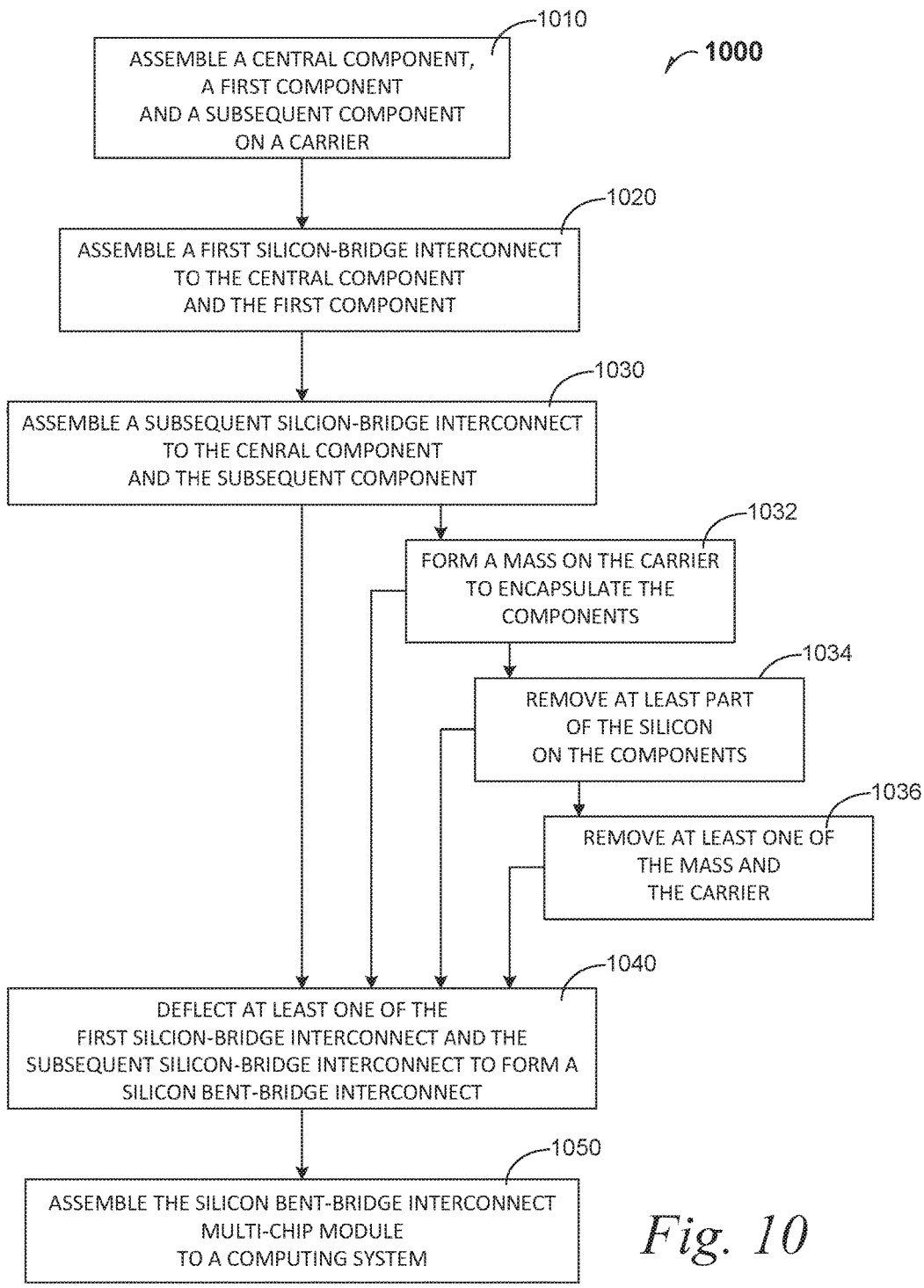
FIG. 10 is a process flow diagram for assembly of a silicon bent-bridge interconnect multi-chip module according to several embodiments.

FIG. 10 is a process flow diagram 1000 for assembly of a silicon bent-bridge interconnect multi-chip module according to several embodiments.

At 1010, the assembly process includes assembling a central component, a first component and a subsequent component on a carrier.

At 1020, the assembly process includes assembling a first silicon-bridge interconnect to the central component and the first component.

At 1030, the assembly process includes assembling a subsequent silicon-bridge interconnect to the central component and the subsequent component.

At 1032, the assembly process includes forming a mass on the carrier to encapsulate the components.

At 1034, the assembly process includes removing at least part of the silicon on the components.

At 1036, the assembly process includes removing at least one of the mass and the carrier.

At 1040, the assembly process includes deflecting at least one of the first silicon-bridge interconnect and the subsequent silicon-bridge interconnect to form at least one silicon bent-bridge interconnect.

At 1050, the assembly process includes assembling the silicon bent-bridge interconnect to a computing system. Further computing system embodiments are set forth in this disclosure.

Figure 11:
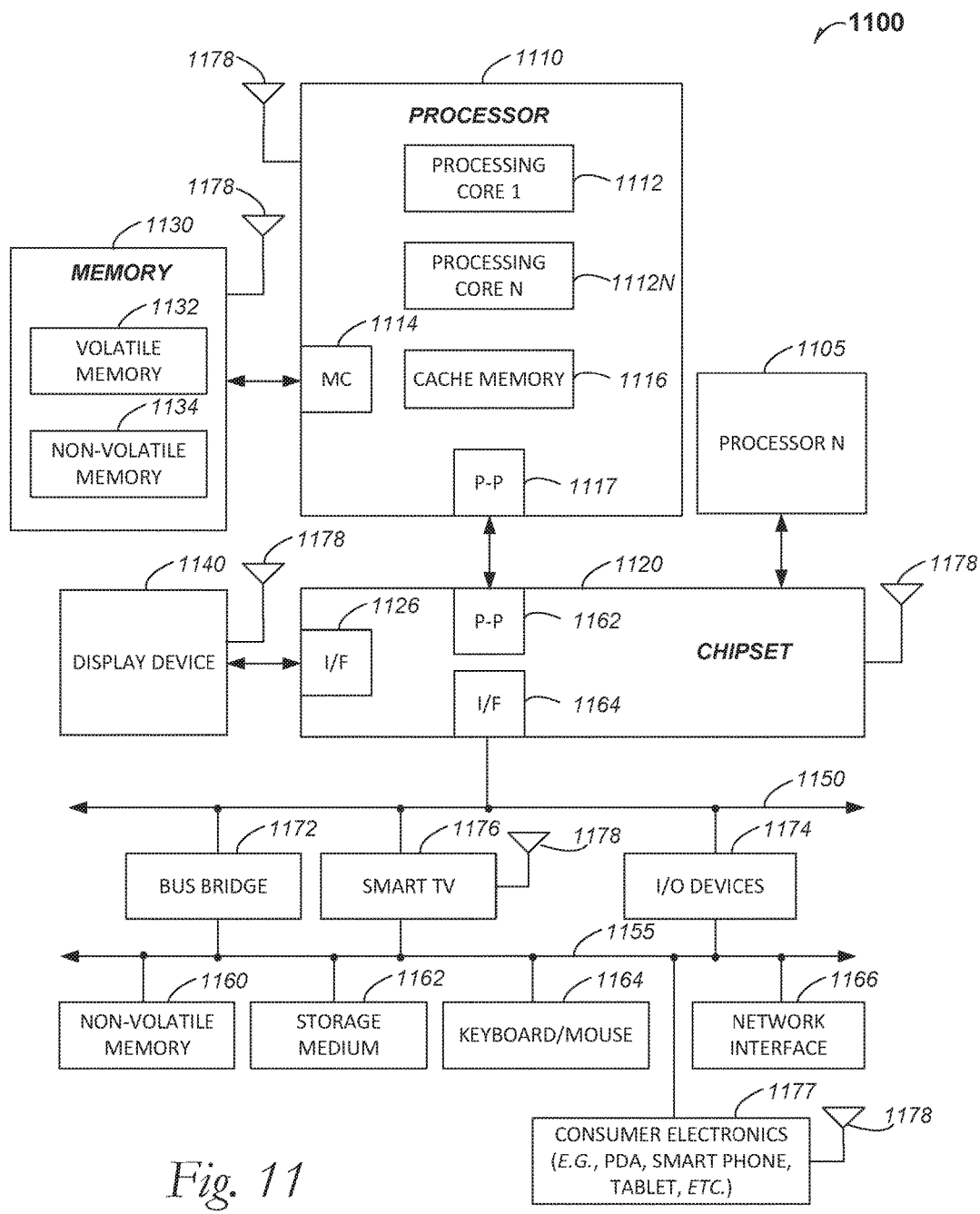
FIG. 11 is included to show an example of a higher level device application for the disclosed embodiments.

FIG. 11 is included to show an example of a higher level device application for the disclosed embodiments. The silicon bent-bridge interconnect embodiments may be found in several parts of a computing system. In an embodiment, a silicon bent-bridge interconnect computing system 1100 includes, but is not limited to, a desktop computer. In an embodiment, a silicon bent-bridge interconnect system 1100 includes, but is not limited to a laptop computer. In an embodiment, a silicon bent-bridge interconnect system 1100 includes, but is not limited to a netbook. In an embodiment, a silicon bent-bridge interconnect system 1100 includes, but is not limited to a tablet. In an embodiment, a silicon bent-bridge interconnect system 1100 includes, but is not limited to a notebook computer. In an embodiment, a silicon bent-bridge interconnect system 1100 includes, but is not limited to a personal digital assistant (PDA). In an embodiment, a system 1100 includes, but is not limited to a server. In an embodiment, a silicon bent-bridge interconnect computing system 1100 includes, but is not limited to a workstation. In an embodiment, a silicon bent-bridge interconnect system 1100 includes, but is not limited to a cellular telephone. In an embodiment, a silicon bent-bridge interconnect system 1100 includes, but is not limited to a mobile computing device. In an embodiment, a silicon bent-bridge interconnect system 1100 includes, but is not limited to a smart phone. In an embodiment, a silicon bent-bridge interconnect system 1100 includes, but is not limited to an internet appliance. In an embodiment, the silicon bent-bridge interconnect is part of a wearable computing system. In an embodiment, the silicon bent-bridge interconnect computing system is part of a drone. Other types of computing device may be configured with the silicon bent-bridge interconnect computing system that includes non-planar interconnect embodiments.

In an embodiment, the processor 1110 has one or more processing cores 1112 and 1112N, where 1112N represents the Nth processor core inside processor 1110 where N is a positive integer. In an embodiment, the electronic device system 1100 using a silicon bent-bridge interconnect embodiment that includes multiple processors including 1110 and 1105, where the processor 1105 has logic similar or identical to the logic of the processor 1110. In an embodiment, the processing core 1112 includes, but is not limited to, pre-fetch logic to fetch instructions, decode logic to decode the instructions, execution logic to execute instructions and the like. In an embodiment, the processor 1110 has a cache memory 1116 to cache at least one of instructions and data for the planar package-substrate apparatus in the system 1100. The cache memory 1116 may be organized into a hierarchal structure including one or more levels of cache memory.

In an embodiment, the processor 1110 includes a memory controller 1114, which is operable to perform functions that enable the processor 1110 to access and communicate with memory 1130 that includes at least one of a volatile memory 1132 and a non-volatile memory 1134. In an embodiment, the processor 1110 is coupled with memory 1130 and chipset 1120. The processor 1110 may also be coupled to a wireless antenna 1178 to communicate with any device configured to at least one of transmit and receive wireless signals. In an embodiment, the wireless antenna interface 1178 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 1132 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1134 includes, but is not limited to, flash memory, phase change memory (PCM), read-only memory (ROM), electrically erasable programmable read-only memory (EEPROM), or any other type of non-volatile memory device.

The memory 1130 stores information and instructions to be executed by the processor 1110. In an embodiment, the memory 1130 may also store temporary variables or other intermediate information while the processor 1110 is executing instructions. In the illustrated embodiment, the chipset 1120 connects with processor 1110 via Point-to-Point (PtP or P-P) interfaces 1117 and 1122. Either of these PtP embodiments may be achieved using a silicon bent-bridge interconnect embodiment as set forth in this disclosure. The chipset 1120 enables the processor 1110 to connect to other elements in the silicon bent-bridge interconnect embodiments in a system 1100. In an embodiment, interfaces 1117 and 1122 operate in accordance with a PtP communication protocol such as the Intel® QuickPath Interconnect (QPI) or the like. In other embodiments, a different interconnect may be used.

In an embodiment, the chipset 1120 is operable to communicate with the processor 1110, 1105N, the display device 1140, and other devices 1172, 1176, 1174, 1160, 1162, 1164, 1166, 1177, etc. The chipset 1120 may also be coupled to a wireless antenna 1178 to communicate with any device configured to at least do one of transmit and receive wireless signals.

The chipset 1120 connects to the display device 1140 via the interface 1126. The display 1140 may be, for example, a liquid crystal display (LCD), a plasma display, cathode ray tube (CRT) display, or any other form of visual display device. In and embodiment, the processor 1110 and the chipset 1120 are merged into a silicon bent-bridge interconnect apparatus in a system. Additionally, the chipset 1120 connects to one or more buses 1150 and 1155 that interconnect various elements 1174, 1160, 1162, 1164, and 1166. Buses 1150 and 1155 may be interconnected together via a bus bridge 1172 such as at least one silicon bent-bridge interconnect embodiment. In an embodiment, the chipset 1120 couples with a non-volatile memory 1160, a mass storage device(s) 1162, a keyboard/mouse 1164, and a network interface 1166 by way of at least one of the interface 1124 and 1174, the smart TV 1176, and the consumer electronics 1177, etc.

In and embodiment, the mass storage device 1162 includes, but is not limited to, a solid state drive, a hard disk drive, a universal serial bus flash memory drive, or any other form of computer data storage medium. In one embodiment, network interface 1166 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax. or any form of wireless communication protocol.

While the modules shown in FIG. 11 are depicted as separate blocks within the silicon bent-bridge interconnect embodiment in a computing system 1100, the functions performed by some of these blocks may be integrated within a single semiconductor circuit or may be implemented using two or more separate integrated circuits. For example, although cache memory 1116 is depicted as a separate block within processor 1110, cache memory 1116 (or selected aspects of 1116) can be incorporated into the processor core 1112.

Where useful, the computing system 1100 may have an outer shell. Referring to FIG. 6, the elongated shape 602 is part of a package substrate that forms an outer shell on a silicon bent-bridge interconnect multi-chip module apparatus in a computing system.

To illustrate the silicon bent-bridge interconnect embodiments and assembly methods disclosed herein, a non-limiting list of examples is provided herein:

Example 1 is a multi-chip module, comprising: a central component; a first component, wherein the first component is coupled to the central component by a first silicon bent-bridge interconnect; and a subsequent component, wherein the subsequent component is coupled to the central component by a subsequent silicon-bridge interconnect.

In Example 2, the subject matter of Example 1 optionally includes wherein the central component is a central-processing unit (CPU) semiconductive device, the first component is a first memory module including at least two memory devices, and the subsequent component is a subsequent memory module including at least two memory devices.

In Example 3, the subject matter of any one or more of Examples 1-2 optionally include a fourth component, wherein the central, first and subsequent are configured at right angles to each other, and wherein the fourth component is connected to one of the central, first and subsequent components by a fourth silicon bridge interconnect.

In Example 4, the subject matter of Example 3 optionally includes wherein the central component is a central processing unit (CPU), the first component is a first memory module connected to the CPU by the first silicon bent-bridge interconnect, and the subsequent component is a subsequent memory module connected to the CPU by the subsequent silicon bent-bridge interconnect.

In Example 5, the subject matter of any one or more of Examples 1-4 optionally include a fourth component, wherein the central, first and fourth components are configured at right angles to each other, wherein the fourth component is connected to the central component by a fourth silicon bridge interconnect, and wherein the fourth component is a connector chip.

In Example 6, the subject matter of any one or more of Examples 1-5 optionally include a fourth component, wherein the central first and fourth components are configured at right angles to each other, wherein the fourth component is connected to the central component by a fourth silicon bridge interconnect, and wherein the fourth component is an inertial sensor chip.

In Example 7, the subject matter of any one or more of Examples 1-6 optionally include wherein the first silicon bent-bridge interconnect and the subsequent silicon bent-bridge interconnect are torsioned to form an overall helical form factor.

In Example 8, the subject matter of Example 7 optionally includes a third silicon bent-bridge interconnect coupled to the first component, and wherein the third silicon bent-bridge interconnect is torsioned to match the overall helical form factor; and a fourth component coupled to the first component by the third silicon bent-bridge interconnect.

In Example 9, the subject matter of any one or more of Examples 7-8 optionally include a third silicon bent-bridge interconnect coupled to the first component, and wherein the third silicon bent-bridge interconnect is torsioned to match the overall helical form factor; a fourth component coupled to the first component by the third silicon bent-bridge interconnect; and a fifth component coupled to the fourth silicon bent-bridge interconnect, wherein the fifth component is adjacent the fourth component.

In Example 10, the subject matter of any one or more of Examples 1-9 optionally include a heat sink disposed against the central component, wherein the central component is a central processing unit with a backside surface disposed against the heat sink, wherein the first component is a first memory module with a surface thereof disposed against the heat sink, and wherein the subsequent component is a subsequent component is a subsequent memory module with a surface thereof disposed against the heat sink.

In Example 11, the subject matter of Example 10 optionally includes a fourth component coupled to the central component by a fourth silicon bent-bridge interconnect; and a fifth silicon-bridge interconnect coupled to the central component.

Example 12 is a method of forming a multi-chip module, comprising: assembling a central component, a first component and a subsequent component on a carrier; assembling a first silicon-bridge interconnect between the central component and the first component; assembling a subsequent silicon-bridge interconnect between the central component and the subsequent component; and deflecting at least one of the silicon bridge interconnects to form a silicon bent-bridge interconnect.

In Example 13, the subject matter of Example 12 optionally includes forming a mass on the carrier to encapsulate the central, first and subsequent components and to partially expose the silicon-bridge interconnects but expose silicon of the silicon-bridge interconnects; removing at least part of the silicon of the silicon-bridge interconnects but to leave etchstop layers on the silicon-bridge interconnects; removing the mass; and removing the carrier.

In Example 14, the subject matter of any one or more of Examples 12-13 optionally include urging the central component onto a heat sink to seat the central component; deflecting the first silicon-bridge interconnect to form a first silicon bent-bridge interconnect while seating the first component on the heat sink; and deflecting the subsequent silicon-bridge interconnect to form a subsequent silicon bent-bridge interconnect, while seating the subsequent component on the heat sink.

In Example 15, the subject matter of any one or more of Examples 12-14 optionally include forming a mass on the carrier to encapsulate the central, first and subsequent components and to partially expose the silicon-bridge interconnects but expose silicon of the silicon-bridge interconnects; removing at least part of the silicon of the silicon-bridge interconnects but to leave etchstop layers on the silicon-bridge interconnects; removing the mass; removing the carrier; urging the central component onto a heat sink to seat the central component; deflecting the first silicon-bridge interconnect to form a first silicon bent-bridge interconnect while seating the first component on the heat sink; and deflecting the subsequent silicon-bridge interconnect to form a subsequent silicon bent-bridge interconnect, while seating the subsequent component on the heat sink.

In Example 16, the subject matter of any one or more of Examples 12-15 optionally include wherein deflecting the at least one silicon-bridge interconnect includes deflecting the first and subsequent silicon-bridge interconnects to form a helical form factor.

In Example 17, the subject matter of any one or more of Examples 12-16 optionally include assembling a fourth component to the first component by coupling a third silicon-bridge interconnect between the first component and the fourth component, wherein deflecting the at least one silicon-bridge interconnect includes deflecting the first, subsequent silicon-bridge and third interconnects to form a helical form factor.

Example 18 is a computing system with a multi-chip module, comprising: a central component, wherein the central component is a semiconductive device; a first component, wherein the first component is coupled to the central component by a first silicon bent-bridge interconnect; a subsequent component, wherein the subsequent component is coupled to the central component by a subsequent silicon-bridge interconnect; and an external shell that encloses the central component, the first component and the subsequent component.

In Example 19, the subject matter of Example 18 optionally includes wherein the first component is a first memory module including at least two memory devices, and the subsequent component is a subsequent memory module including at least two memory devices, and wherein the external shell is a fuselage form factor.

In Example 20, the subject matter of any one or more of Examples 18-19 optionally include a fourth component, wherein the central, first and subsequent are configured at right angles to each other, and wherein the fourth component is connected to one of the central, first and subsequent components by a fourth silicon bridge interconnect.

In Example 21, the subject matter of any one or more of Examples 18-20 optionally include a fourth component, wherein the central, first and fourth components are configured at right angles to each other, wherein the fourth component is connected to the central component by a fourth silicon bridge interconnect, and wherein the fourth component is an inertial sensor chip.

In Example 22, the subject matter of any one or more of Examples 18-21 optionally include wherein the first silicon bent-bridge interconnect and the subsequent silicon bent-bridge interconnect are torsioned to form an overall helical form factor.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A multi-chip module, comprising:
a central component;
a first component, wherein the first component is coupled to the central component by a first silicon bent-bridge interconnect; and
a subsequent component, wherein the subsequent component is coupled to the central component by a subsequent silicon-bridge interconnect wherein the first silicon bent-bridge interconnect and the subsequent silicon bent-bridge interconnect are torsioned to form an overall helical form factor.

2. The multi-chip module of claim 1, further including a third silicon bent-bridge interconnect coupled to the first component, and wherein the third silicon bent-bridge interconnect is torsioned to match the overall helical form factor; and
a fourth component coupled to the first component by the third silicon bent-bridge interconnect.

3. The multi-chip module of claim 1, further including:
a third silicon bent-bridge interconnect coupled to the first con and wherein the third silicon bent-bridge interconnect is torsioned to match the overall helical form factor;
a fourth component coupled to the first component by the third silicon bent-bridge interconnect; and
a fifth component coupled to the fourth silicon bent-bridge interconnect, wherein the fifth component is adjacent the fourth component.

4. A multi-chip module, comprising:
a central component;
a first component, wherein the first component is coupled to the central component by a first silicon bent-bridge interconnect; and
a subsequent component, wherein the subsequent component is coupled to the central component by a subsequent silicon-bridge interconnect, further including:
a heat sink disposed against the central component, wherein the central component is a central processing unit with a backside surface disposed against the heat sink, wherein the first component is a first memory module with a surface thereof disposed against the heat sink, and wherein the subsequent component is a subsequent component is a subsequent memory module with a surface thereof disposed against the heat sink.

5. The multi-chip module of claim 4, further including:
a fourth component coupled to the central component by a fourth silicon bent-bridge interconnect; and
a fifth silicon-bridge interconnect coupled to the central component.

6. A method of forming a multi-chip module, comprising:
assembling a central component, a first component and a subsequent component on a carrier;
assembling a first silicon-bridge interconnect between the central component and the first component;
assembling a subsequent silicon-bridge interconnect between the central component and the subsequent component; and
deflecting at least one of the silicon bridge interconnects to form a silicon bent-bridge interconnect, further including:
forming a mass on the carrier to encapsulate the central, first and subsequent components and to partially expose the silicon-bridge interconnects but expose silicon of the silicon-bridge interconnects;
removing at least part of the silicon of the silicon-bridge interconnects but to leave etchstop layers on the silicon-bridge interconnects;
removing the mass; and
removing the carrier.

7. A method of forming a multi-chip module, comprising:
assembling a central component, a first component and a subsequent component on a carrier;

assembling a first silicon-bridge interconnect between the central component and the first component;
assembling a subsequent silicon-bridge interconnect between the central component and the subsequent component; and
deflecting at least one of the silicon bridge interconnects to form a silicon bent-bridge interconnect, further including:
urging the central component onto a heat sink to seat the central component;
deflecting the first silicon-bridge interconnect to form a first silicon bent-bridge interconnect while seating the first component on the heat sink; and
deflecting the subsequent silicon-bridge interconnect to form a subsequent silicon bent-bridge interconnect, while seating the subsequent component on the heat sink.

8. A method of forming a multi-chip module, comprising:
assembling a central component, a first component and a subsequent component on a carrier;
assembling a first silicon-bridge interconnect between the central component and the first component;
assembling a subsequent silicon-bridge interconnect between the central component and the subsequent component; and
deflecting at least one of the silicon bridge interconnects to form a silicon bent-bridge interconnect, further including:
forming a mass on the carrier to encapsulate the central, first and subsequent components and to partially expose the silicon-bridge interconnects but expose silicon of the silicon-bridge interconnects;
removing at least part of the silicon of the silicon-bridge interconnects but to leave etchstop layers on the silicon-bridge interconnects;
removing the mass;
removing the carrier;
urging the central component onto a heat sink to seat the central component;
deflecting the first silicon-bridge interconnect to form a first silicon bent-bridge interconnect while seating the first component on the heat sink; and
deflecting the subsequent silicon-bridge interconnect to form a subsequent silicon bent-bridge interconnect, while seating the subsequent component on the heat sink.

9. A method of forming a multi-chip module, comprising:
assembling a central component, a first component and a subsequent component on a carrier;
assembling a first silicon-bridge interconnect between the central component and the first component;
assembling a subsequent silicon-bridge interconnect between the central component and the subsequent component; and
deflecting at least one of the silicon bridge interconnects to form bent-bridge interconnect, wherein deflecting the at least one silicon-bridge interconnect includes deflecting the first and subsequent silicon-bridge interconnects to form a helical form factor.

10. A method of forming a multi-chip module, comprising:
assembling a central component, a first component and a subsequent component on a carrier;
assembling a first silicon-bridge interconnect between the central component and the first component;
assembling a subsequent silicon-bridge interconnect between the central component and the subsequent component; and
deflecting at least one of the silicon bridge interconnects to form a silicon bent-bridge interconnect, further including assembling a fourth component to the first component by coupling a third silicon-bridge interconnect between the first component and the fourth component, wherein deflecting the at least one silicon-bridge interconnect includes deflecting the first, subsequent silicon-bridge and third interconnects to form a helical form factor.

11. A computing system with a multi-chip module, comprising:
a central component, wherein the central component is a semiconductive device;
a first component, wherein the first component is coupled to the central component by a first silicon bent-bridge interconnect;
a subsequent component, wherein the subsequent component is coupled to the central component by a subsequent silicon-bridge interconnect; and
an external shell that encloses the central component, the first component and the subsequent component, wherein the first silicon bent-bridge interconnect and the subsequent silicon bent-bridge interconnect are torsioned to form an overall helical form factor.

* * * * *

UNITED STATES PATENT AND TRADEMARK OFFICE
CERTIFICATE OF CORRECTION

PATENT NO. : 10,431,545 B2
APPLICATION NO. : 15/637641
DATED : October 1, 2019
INVENTOR(S) : Seidemann et al.

Page 1 of 1

It is certified that error appears in the above-identified patent and that said Letters Patent is hereby corrected as shown below:

In the Claims

In Column 16, Line 16, in Claim 3, delete "con" and insert --component,-- therefor In Column 18, Line 10, in Claim 9, after "form", insert --a silicon--

Signed and Sealed this
Twelfth Day of May, 2020

Andrei Iancu
*Director of the United States Patent and Trademark Office*